United States Patent [19]
Devin et al.

[11] Patent Number: 5,953,253
[45] Date of Patent: Sep. 14, 1999

[54] WORD ADDRESSABLE FLOATING-GATE MEMORY COMPRISING A REFERENCE VOLTAGE GENERATOR CIRCUIT FOR THE VERIFICATION OF THE CONTENTS OF A WORD

[75] Inventors: Jean Devin, Aix-en-Provence; Bruno Leconte, Rousset, both of France; Alessandro Brigati, Castelsangiovanni, Italy

[73] Assignee: SGS-Thomson Microelectronics S.A., Gentilly, France

[21] Appl. No.: 09/035,654

[22] Filed: Mar. 6, 1998

[30] Foreign Application Priority Data

Mar. 20, 1997 [FR] France ................... 97 03578

[51] Int. Cl.$^6$ .................................................. G11C 16/06
[52] U.S. Cl. ............................. 365/185.22; 365/185.12; 365/185.23
[58] Field of Search ................... 365/185.22, 185.12, 365/185.23

[56] References Cited

U.S. PATENT DOCUMENTS

| | | | |
|---|---|---|---|
| 5,142,495 | 8/1992 | Canepa | 365/185.2 |
| 5,568,426 | 10/1996 | Roohparvar et al. | 365/185.22 |
| 5,579,262 | 11/1996 | Song | 365/185.33 |
| 5,715,195 | 2/1998 | Smayling et al. | 365/185.22 |
| 5,745,411 | 4/1998 | Usami | 365/185.09 |

FOREIGN PATENT DOCUMENTS 0 130 129 A1  1/1985  European Pat. Off. .
0 255 963 A2  2/1988  European Pat. Off. .

*Primary Examiner*—Andrew Q. Tran
*Attorney, Agent, or Firm*—Allen, Dyer, Doppelt, Milbrath & Gilchrist, P.A.

[57] ABSTRACT

An electrically programmable non-volatile memory organized in n-bit words includes a generator circuit to produce a verification voltage to perform a verification of a word in the memory. The generator circuit adjusts the verification voltage as a function of an information element that corresponds to the word to be verified.

26 Claims, 2 Drawing Sheets

WORD ADDRESSABLE FLOATING-GATE MEMORY COMPRISING A REFERENCE VOLTAGE GENERATOR CIRCUIT FOR THE VERIFICATION OF THE CONTENTS OF A WORD

FIELD OF THE INVENTION

The invention relates to memories, and, more particularly, to a word-addressable floating-gate memory comprising a reference voltage generator circuit for the verification of the contents of a word. This invention can be applied especially to memories organized in words and performing a verification during the write operation.

BACKGROUND OF THE INVENTION

Floating-gate memories memorize or store data bits by means of electrical charges accumulated in their floating gates. The accumulation of charges in the floating gate acts on the threshold voltage Vt of each floating-gate transistor, and the effect is expressed in many ways. It may be assumed that the charging of the floating gate acts on the current flowing through the channel of the transistor or acts on the resistance of the channel (the reasoning is equivalent in both cases).

During the reading of these memories, the cell to be read is connected to a bit line which has available a resistive or current source type of load that is used to preamplify the information contained in the transistor and to convert the current flowing through the storage transistor (or the equivalent resistor of the channel) into a voltage at the terminals of the storage cell. The voltage at the terminals of the cell is compared with a read reference voltage that corresponds to an intermediate voltage which differentiates the logic levels memorized.

One technique used to carry out a write operation or an erasure of these memories includes charging or discharging the floating gates of the transistors of the storage cells up to a predefined level. This predefined level corresponds to the read reference voltage plus or minus an additional voltage corresponding to a "safety margin" to ensure that the information is maintained over time in the storage transistor. To be sure of reaching the desired level, a verification may be made of the write or erasure operation. The verification makes it possible to reduce the programming and erasure times for all that is done is to attain the appropriate level without its being necessary to use a defined programming or erasure time to be sure of reaching the appropriate level in the worst possible case. Furthermore, in certain memories, excess charges may prompt errors requiring a routine check on write and erasure operations.

The verification of a write or erasure operation is done as a read operation that uses low-level or high-level reference voltages which take into account the safety band. Furthermore, the storage cells may be grouped by word to use a selection transistor common to the entire word. If it is sought to use the verification of writing and erasure with memories organized in words, it is necessary to take into account the word selection transistor. Indeed, the selection transistor is series-connected with all the word storage transistors, and collects the sum of the currents flowing through each storage transistor.

To provide a clearer explanation of what happens, the example used here is that of a memory whose "erased" state corresponds to a charged state of the floating gate of the storage transistor, such that the threshold voltage Vt of the storage transistor is small but positive. The "written" state of a storage transistor is expressed by a floating gate whose charge corresponds to a high threshold voltage Vt of the transistor, making the storage transistor almost off. The drain-source voltage of a storage transistor, when it is selected, must be lower than V1 in order to have the certainty that it is truly erased, and greater than V2 to have the certainty that it is truly written.

During the erasure of the word, the floating gates of the storage transistors of the word to be erased are charged and then, for verification, the contents of the word are read by using, as a reference voltage, a voltage V1 added to the drain-source voltage of the word selection transistor. For the writing, the gates of certain of the storage transistors are charged as a function of the word to be written, and then a read operation is performed in using a write reference voltage that corresponds to the voltage V2 plus the drain-source voltage of the word selection transistor.

For example, when the storage transistors are on, the currents flowing through each storage transistor are in the range of 50 $\mu$A and the resistance of the channel of the selection transistor is in the range of 1 k$\Omega$. If 8-bit words are used, the reference voltage to be used for the erasure must be equal to V1+0.4 volts. However, those skilled in the art will see that the voltage to be added to V2 may be variable as a function of the word written. It therefore appears to be necessary to raise the voltage to be added to V2 to obtain the write reference voltage. The computation of the reference voltage must, therefore, take into account the worst case which corresponds to a single bit to be written. The reference voltage should be equal to V2+0.35 volts.

SUMMARY OF THE INVENTION

An object of the invention is an electrically programmable non-volatile memory organized in n-bit words comprising a generator circuit to produce a verification voltage to carry out a verification of a word in the memory, and wherein the generator circuit comprises means to adjust the verification voltage as a function of an information element that corresponds to the word to be verified.

In other words, to optimize the charges of the floating gates during the writing and reading operations, the invention proposes to use a reference voltage that is variable as a function of the word to be written. The variable reference voltage takes into account the current flowing through the selection transistor of a word to be memorized which is a function of the current flowing through each storage transistor of the word to be memorized. A system of this kind furthermore enables the charging and discharging at least of the floating gate cells of the storage transistors, thus producing a saving of time and energy.

Preferably, the generator circuit comprises first means to give a first voltage proper to the voltage desired at the terminals of a storage transistor which is in the first state, and second means to correct the first voltage as a function of the information. With a view to simplicity of calibration, preferably floating-gate transistors are used with their floating gates charged to correspond to a first state of an ideally memorized bit or to correspond to a second state of an ideally memorized bit. The generator circuit reproduces the elements of a storage matrix which is the cause of the modification of the voltage.

BRIEF DESCRIPTION OF THE DRAWINGS

Other features and advantages shall appear from the following description, made with reference to the appended drawings, of which.

DETAILED DESCRIPTION OF THE PREFERRED EMBODIMENTS

Figure 1:
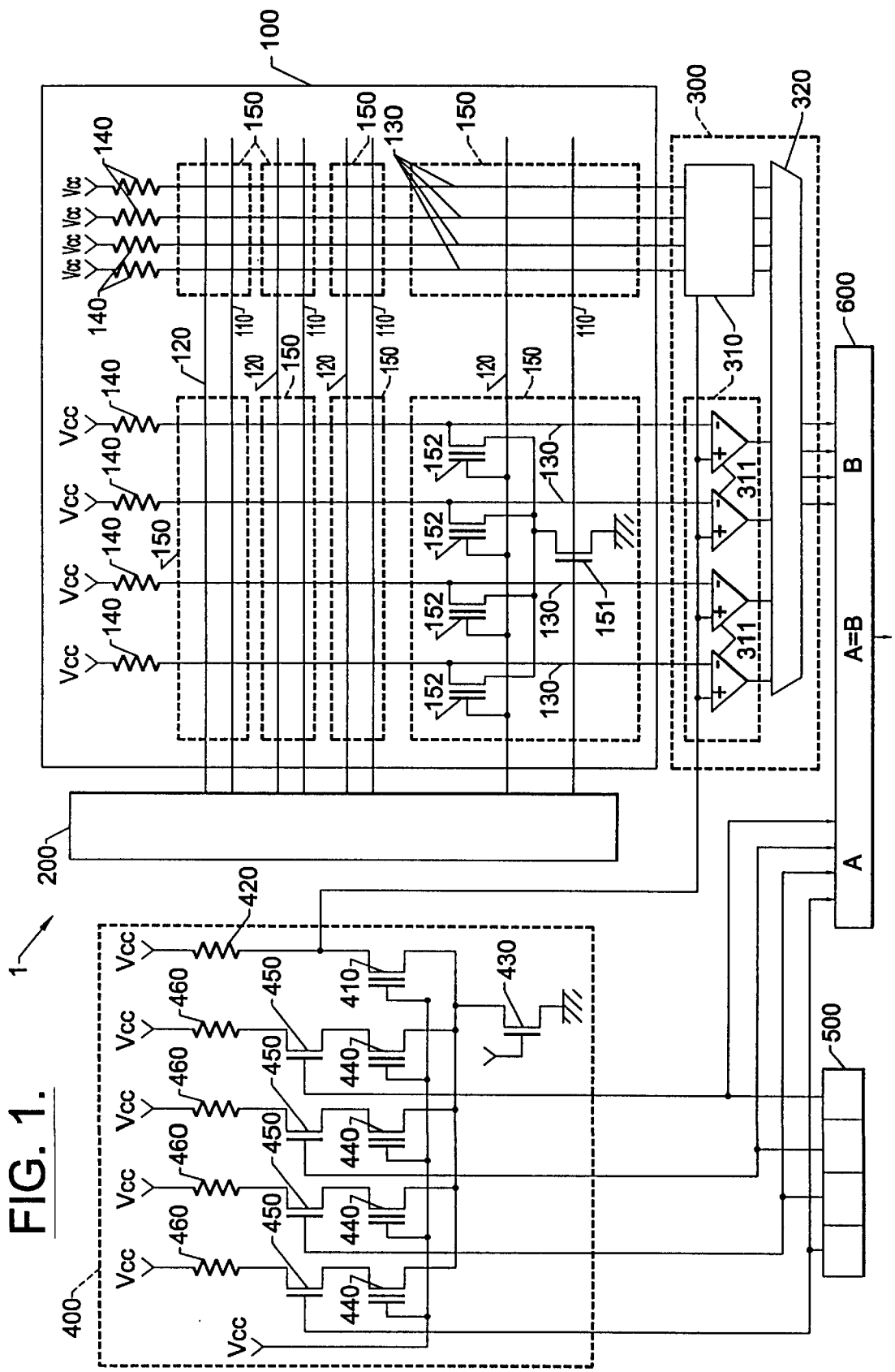
FIG. 1 shows a floating-gate memory whose storage matrix is connected to perform a verification after reading according to the invention.

FIG. 1 shows a preferred embodiment corresponding to the elements needed by the memory to carry out a verification of a write operation. The write means are not shown so as not to unnecessarily complicate the description. Similarly, numerous circuits that fulfill a variety of functions in a memory, but which do not play a direct role in the verification of writing, have been deliberately omitted for clarity.

As is known to those skilled in the art, there are various alternative ways possible to show bits in a floating-gate memory. In the example described, the level "1" is represented by a floating-gate transistor whose floating gate is charged in such a way that the storage transistor can be controlled as a MOS transistor with a low positive threshold voltage Vt. The level "0" is represented by a floating-gate transistor whose floating gate is charged in such a way that the floating-gate transistor can be likened to a MOS transistor with high threshold voltage Vt, making it almost off even when its gate is subjected to a certain potential during the read operation. Furthermore, in the example chosen, the storage cells are considered to be erased when they contain the value "1", with the write operation recording solely "zeros" where they are needed.

The memory 1 shown in FIG. 1 comprises a storage matrix 100, a row decoder 200, a read device 300, a generator circuit 400, a storage register 500 and a comparison circuit 600. The matrix 100 comprises word selection lines 110, gate lines 120, and bit lines 130. The word selection lines 110 and the gate lines 120 are connected to the row decoder 200 so as to determine which word selection line 110 of the matrix 100 is active and which potential must be applied to a gate line 120 associated with the active word selection line 110.

Each of the bit lines 130 is connected firstly to a load 140, for example of a resistive type and, secondly, to the read device 300. The loads 140 are also connected to a supply voltage Vcc. Furthermore, the matrix 100 has storage circuits 150. Each storage circuit 150 is crossed by a word selection line 110, a gate line 120 and four bit lines 130 to memorize a 4-bit word.

In the present example, the storage circuit comprises a word selection transistor 151 and four floating-gate type storage transistors 152. In the storage circuit, each storage transistor 152 has its gate connected to the gate line 120, its drain connected to one of the bit lines 130 and its source connected to the drain of the selection transistor 151. Furthermore, the selection transistor 151 has its gate connected to the word selection line 110 which crosses the storage circuit 150, and its source connected to the ground.

The loads 140 carry out the preamplification of the information contained in the storage circuit 150 and convert the current flowing through each storage transistor 152 into a bit line voltage. The matrix 100 is said to be organized in words because, for a storage circuit 150 used to memorize a word, there is a selection transistor 151 common to all the storage transistors 152 of the storage circuit 150.

The row decoder 200 receives a first part of a storage address on a bus, not shown, and, accordingly, supplies only one of the selection lines 110 and only one of the gate lines 120. Different voltages may be applied to these lines depending on whether a write operation, an erasing operation or a read operation is performed. In the present example, we shall deal only with the case of a read operation where the selection lines 110 and the gate lines 120 are supplied by one and the same potential close to Vcc.

The read device 300 comprises read circuits 310 and a multiplexer 320. Each read circuit 310 is connected to four bit lines 130 so as to enable the reading of the contents of a word column. Each read circuit 310 receives a comparison voltage coming from the generator circuit 40 on a reference wire. Each read circuit 310 comprises four outputs each giving a shaped binary information element. The multiplexer 320 is connected to all the outputs of all the read circuits 310 and has four outputs available. The four outputs give the contents of a word selected from among all the words read at the read circuit 310, the control of the multiplexer (not shown) corresponding to a second part of the storage address.

The read circuits 310 are each provided, for example, by four differential amplifiers 311 used as comparators and having available two inputs and one output. One of the inputs of each amplifier 311 is connected to the reference line. The other input of each amplifier 311 is connected to one of the bit lines 130. The output of each amplifier 311 gives a signal corresponding to a "1" if the comparison voltage is greater than the voltage of the bit line 130, and gives a "0" if the comparison voltage is smaller than the voltage of the bit line 130. In the present example, the read device 300 is used to verify a read operation. The comparison voltage is therefore a write verification voltage. To perform a normal reading operation or a verification of erasure, it is possible to use several read devices 300 in parallel using different comparison voltages, or only one read device 300 in which the comparison voltage may be switched over among several reference voltages.

The generator circuit 400 comprises a first floating-gate transistor 410 identical to a storage transistor 152 whose drain is connected to Vcc by means of a load 420 identical to the load 140 of a bit line 130. The source of the first transistor 410 is connected to the ground by means of a MOS transistor 430 identical to the selection transistor 151. The gate of the first transistor 410 is connected to Vcc. The node between the first transistor 410 and the load 420 corresponds to the output of the generator circuit 400 which gives the comparison voltage used for the verification.

The assembly formed by the first transistor 410, the load 420, and the MOS transistor 430 provides first means used to generate a voltage equivalent to the voltage that it is sought to obtain on the storage transistors 152 when the programming is done. In order that the comparison voltage may correspond to the programming voltage, the floating gate of the first transistor 410 should be charged in a manner that is ideal for a program transistor. The floating gate of the first transistor 410 should therefore be charged in an ideal manner in a testing phase during manufacture. To ensure that the charging of the floating gate of the first transistor 410 is maintained in time, a margin should be planned (several tens of mV on the drain-source voltage). This first transistor 410 should not be incorporated into the storage matrix so as not to be subjected to programming and erasure voltages during the normal operation of the memory, because these different stresses adversely modify the charge of the floating gate of the storage transistors 152.

The generator circuit 400 furthermore comprises second means to correct the comparison voltage as a function of the word that is verified in the matrix 100. These second means comprise:

four second floating-gate transistors 440 whose floating gates are charged to correspond to a storage transistor 152 erased in an ideal manner, the sources of the second transistors 440 being connected to the source of the first transistor 410, the gates of the second transistors being connected to Vcc;

four switching transistors 450 whose sources are respectively connected to the drains of the four second transistors 440 and whose gates are connected to the parallel outputs of the storage register 500 containing the word to be verified in the matrix 100; and four loads 460 identical to the loads 140 of the bit lines 130 of the matrix, each of the loads 460 being connected firstly to Vcc and, secondly, respectively to the drains of the four switching transistors 450.

The second transistors 440 are charged during the same testing phase in which the first transistor 410 is charged. For the second transistors 440, it is not necessary to have an additional safety margin, but it is preferable to place these second transistors 440 outside the matrix 100.

The second means herein act by the addition of a current depending on the word that has just been written in the MOS transistor 430, with the storage register 500 containing the word that has just been written in the matrix 100. In the present example, the bits at "1" contained in the storage register 500 each give rise to the conduction of a switching transistor 450 each adding a current equal to the current of a storage transistor 152 containing a "1" in the MOS transistor 430. The MOS transistor 430 is crossed by a current equal to the sum of the currents going through the storage transistor 152 positioned at "1" plus the current of the storage transistor 152 positioned at "0" The error on the current flowing through the MOS transistor 430, as compared with the selection transistor 151, is equal to the number of bits positioned at "0" minus one, multiplied by the current going through a storage transistor containing a "0", giving at worst some millivolts. The comparison voltage given by the generator circuit 400 corresponds to the verification voltage for it is equal to the voltage desired for a programmed transistor (set at "0").

The comparator 600 has first and second input buses and one output. The first input bus is connected to the storage register 500 and the second input but is connected to the outputs of the multiplexer 320. The output of the comparator 600 is in a first state if the contents of the storage register 500 correspond to the reading performed by the read device circuit 300 and is in a second state if there is no correspondence.

With a device of this kind, a write operation is performed as follows:

the loading of a word to be read into the storage register 500 and of an address into the address register;

the writing of the word present in the storage register 500 in a storage circuit 150 corresponding to the address of the address register;

the reading of the word present in the storage circuit 150 that has just been written by using the circuits shown in FIG. 1; and the repetition of the write and read operations so long as the output of the comparison circuit does not indicate any matching between the word present in the storage register 500 and the word read in the storage circuit 150.

The time needed for the programming is reduced to the minimum time necessary to actually write the word in the storage circuit 150. The verification read operations take a negligible time as compared with the effective write operations. If necessary, the number of writing attempts may be limited to a maximum number.

Numerous modifications can be envisaged without modifying the object of the invention. The matrix 100 may be made according to numerous variants as known in the prior art depending on whether they are EEPROM type or FLASH type memories or depending on certain arbitrary choices. Modifications of the generator circuit 400 have to planned to correspond to the matrix chosen by those skilled in the art. Thus, in the generator circuit 400, the resistive loads 140, 420 and 460 may be replaced by current sources. The ground and Vcc may be reversed. The gates of the first and second transistors 410 and 440 may be unconnected. The N channel transistors may be replaced by P channel transistors. The charges of the floating gates may be reversed between the first transistor 410 and the second transistor 440. The modifications are carried out to make the generator circuit 400 compatible with other types of memories organized in words.

Figure 2:
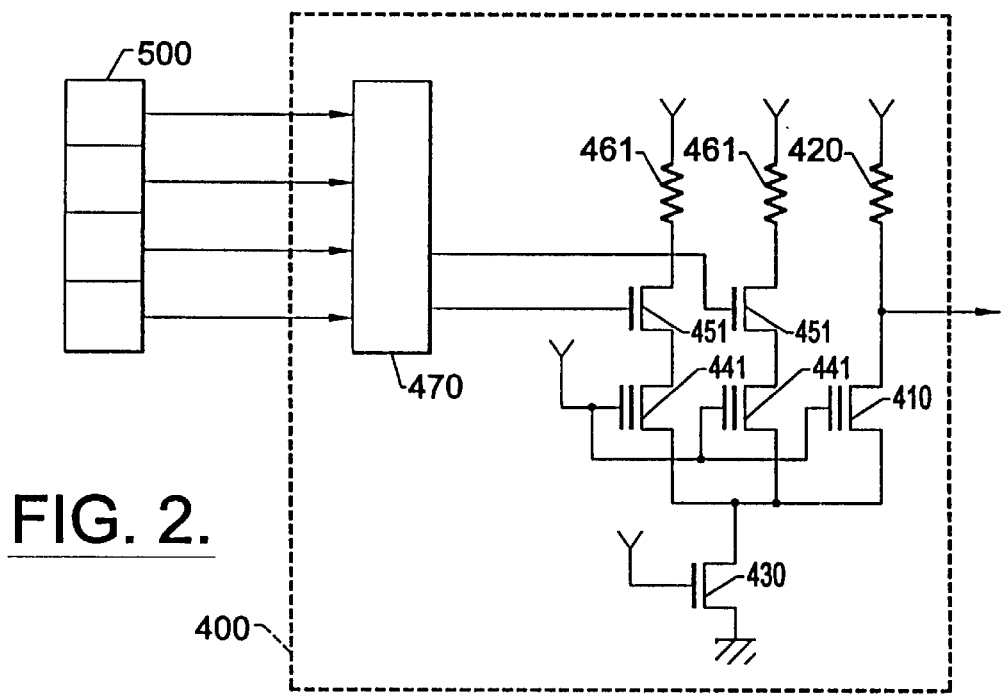
FIGS. 2 to 4 show alternative embodiments of the voltage generator circuit according to the invention.

Similarly, any read device may be adapted, the generator circuit 400 providing a reference voltage to perform a verification read operation. The generator circuit 400 of FIG. 1 may be modified, for example, as shown in FIG. 2. The first means of the generator circuit 400 of FIG. 1 are kept in FIG. 2. However, the second means have been replaced by:

second floating-gate transistors 441 whose floating gates are charged to correspond to a storage transistor 152 erased in an ideal manner, the sources of the second transistors 441 being connected to the source of the first transistor 410, the gates of the second transistors 441 being connected to Vcc;

a decoder 470 receiving the word to be verified in the memory from the four parallel outputs of the storage register 500 and giving, on two control wires, a binary data element representing the number of bits obtained in the storage register 500 that are positioned at "1";

two switching transistors 451 whose sources are respectively connected to the drains of the second transistors 441 and whose gates are connected to the control wires; and two loads 461, respectively representing a load 140 and a semi-load 140 of one of the bit lines 130 of the matrix 100, each of the loads 461 being connected firstly to Vcc and, secondly, respectively to the drains of the switching transistors 451.

The decoder 470 gives a least significant information element and a most significant information element, the most significant information element having to be received by the switching transistor 451 connected to the least significant load 461. This circuit uses a smaller surface area than the circuit of FIG. 1. The gain in surface area occupied is all the greater as the size of the word to be written is great. More generally, when a memory organized in $2^m$ bits is used, it is possible to use m second transistors 441, m switching transistors 451 and m loads 461 corresponding to a fraction ranging from 1 to $2^{m-1}$ of the load 140 of a bit line 130. This means that there will be a load 461 identical to a load 140, a load 461 equal to half a load 140, another load 461 equal to a quarter, another equal to one-eighth and so on and so forth up to $2^m$. Naturally, if the resistive loads are replaced by current sources, the sources will be multiples of a power of two of the source of the bit line 130.

Figure 3:
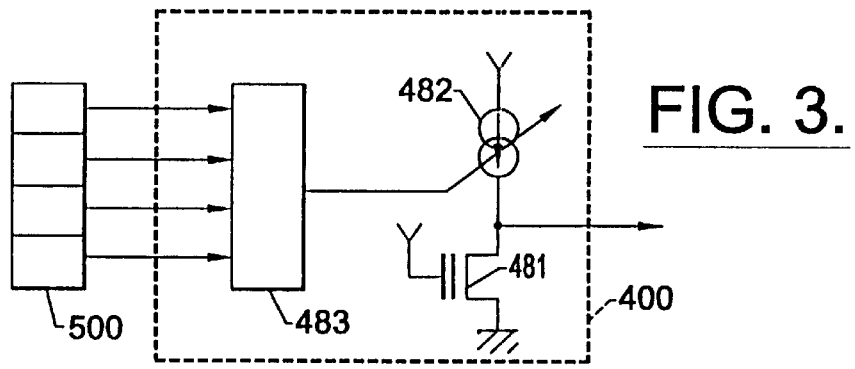

More generally, it is possible to use the circuit of FIG. 3. In this FIG. 3, the first and second means are connected The first means is provided by a single floating-gate transistor 481 whose floating gate is charged to correspond to a storage transistor 152 programmed in an ideal way and biased by a current source 482. The gate of the transistor 481 is connected to Vcc. The source of the transistor 481 is connected to the ground. The drain of the transistor 481 is connected to the source 482 and is used as an output for the generator circuit. The source is furthermore connected to Vcc. The second means comprise a decoder 483 receiving the word to be verified in the memory from the four parallel outputs of the storage register 500 and giving a command representing the number of bits contained in the storage register 500 that are positioned at "1", the command acting on the current source 482. In the present example, the resistance of the channel of a storage transistor is very high when this transistor is programmed. It is therefore sufficient to obtain a very slight variation in the current to have a voltage response that corresponds to a current flowing through a erased storage transistor 152, thereby causing a reduction in the consumption of the generator circuit 400.

Figure 4:
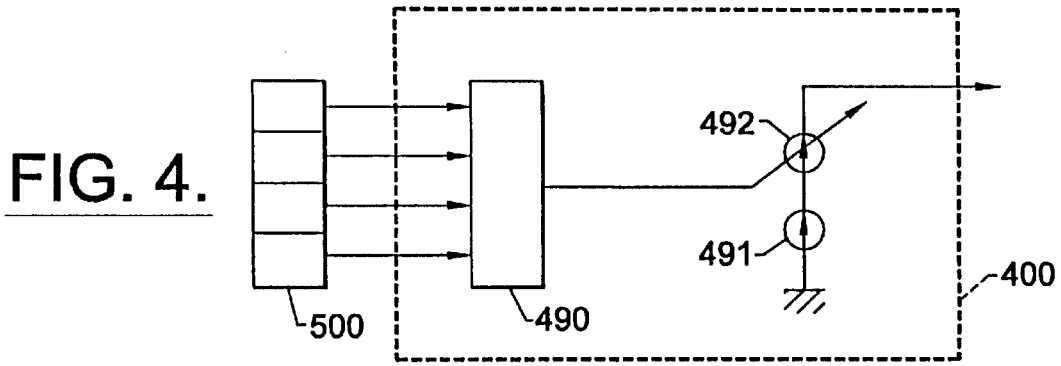

In FIG. 4, the circuit 400 comprises a decoder 490 receiving the four parallel outputs from the storage register 500 and giving a command representing the word contained in the storage register 500. A fixed voltage source 491 gives a voltage equal to the voltage desired for an ideally programmed storage transistor 152 and a variable voltage source 492 receives the command from the decoder 490 to give a correction voltage. Two sources 491 and 492 are series-connected between the ground and the output of the generator circuit 400 in such a way that the generator circuit 400 produces a voltage adjusted as a function of the word to be verified in the matrix 100.

Those skilled in the art will understand that the modifications envisaged for the generator circuit of FIG. 1 are also valid for the circuits of FIGS. 2 to 4. Furthermore, the numerical values cited in the description are arbitrary and have been chosen only to provide greater clarity to the description. Thus, the numbers of rows and columns shown in the matrix 100 and the number of bits in a word may be different. This is also true for the values of current and voltage referred to.

In the present example, the circuit is used to verify a writing operation. It could also be used to verify an erasure if this operation does not erase all the bits of a word at the same time. The problem raised becomes the same for writing and erasure operations.

That which is claimed is:

1. An electrically programmable non-volatile memory organized in n-bit words and comprising:
   a generator circuit to produce a verification voltage to carry out a verification of a word in the memory;
   said generator circuit comprising means for adjusting the verification voltage as a function of an information element that corresponds to the word to be verified.

2. A memory according to claim 1, further comprising at least one storage transistor having terminals; and wherein said generator circuit comprises:
   first means for supplying a first voltage corresponding to a voltage desired at the terminals of the at least one storage transistor which is in a first state; and
   second means for correcting the first voltage as a function of the information element that corresponds to the word to be verified.

3. A memory according to claim 2, wherein said first means comprises a first floating-gate transistor having a floating-gate charged to correspond to a first state of a bit memorized in an ideal manner.

4. A memory according to claim 3, further comprising a plurality of bit lines and respective loads connected thereto; wherein said first means comprises a first load substantially identical to the load of a bit line and being connected between a first reference voltage and a drain of the first floating-gate transistor; and wherein the verification voltage is provided from a node between the first load and the first floating-gate transistor.

5. A memory according to claim 4, wherein said first means further comprises a second transistor for connecting a source of the first floating-gate transistor to a second reference voltage.

6. A memory according to claim 4, further comprising a register having parallel outputs for containing the information representing the word to be verified in the memory; and wherein the second means comprises:
   n second floating-gate transistors having floating gates charged to correspond to a second state of a bit memorized in an ideal manner, the n second floating-gate transistors also having sources being connected to the source of the first floating-gate transistor;
   n switching transistors having sources respectively connected to drains of the n second floating-gate transistors and having gates connected to parallel outputs of the register containing the information representing the word to be verified in the memory; and
   n loads substantially identical to the loads of the bit lines, each of the n loads being connected firstly to the first reference voltage and, secondly, respectively, to drains of the n switching transistors.

7. A memory according to claim 4, further comprising a register having parallel outputs for containing the information representing the word to be verified in the memory, wherein $n=2^m$, and wherein the second means comprises:
   m second floating-gate transistors having floating gates charged to correspond to a second state of a bit memorized in an ideal manner, the m second floating-gate transistors having sources connected to the source of the first floating-gate transistor;
   a decoder receiving n parallel outputs from the register containing the word to be verified in the memory and supplying, on m control lines, a binary data element representing a number of bits of the information element that are in the second state; and
   m switching transistors having sources respectively connected to drains of the m second floating-gate transistors and having gates connected to the m control lines.

8. A memory according to claim 7, wherein the second means comprises m loads, each representing a fraction, ranging from 1 to $2^{m-1}$, of the load of a bit line, each of the m loads being connected firstly to the first reference voltage and, secondly, respectively to drains of the m switching transistors.

9. A memory according to claim 7, further comprising a plurality of second bit lines and respective current sources connected thereto for serving as loads; wherein the second means comprises m current sources each representing a multiple of a power of two of a current source used as a load, each of the m current sources being connected firstly to the first reference voltage and, secondly, respectively to drains of the m switching transistors.

10. A memory according to claim 2, further comprising a register having n parallel outputs containing the information representing the word to be verified in the memory; wherein the second means comprises a decoder receiving the n parallel outputs from the register and outputting a command representing a number of bits of the information element that are in the second state.

11. A memory according to claim 10, wherein the second means comprises a controlled current source which receives the command; wherein the controlled current source has a first terminal connected to a first reference voltage; and wherein the first means comprises a floating-gate transistor having a floating-gate charged to correspond to a first state of a bit memorized in an ideal manner, the floating-gate transistor having a drain being connected to a second terminal of the controlled current source, the floating-gate transistor having a source being connected to a second reference voltage, a node located between the controlled current source and the floating-gate transistor supplying the verification voltage.

12. An electrically programmable non-volatile memory organized in n-bit words and comprising:
   a plurality of storage transistors;
   a generator circuit to produce a verification voltage to carry out a verification of a word in the memory, said generator circuit comprising
      first means for supplying a first voltage corresponding to a voltage desired at the terminals of a storage transistor which is in a first state, and
      second means for correcting the first voltage as a function of an information element that corresponds to the word to be verified.

13. A memory according to claim 12, wherein said first means comprises a first floating-gate transistor having a floating-gate charged to correspond to a first state of a bit memorized in an ideal manner.

14. A memory according to claim 13, further comprising a plurality of bit lines and respective loads connected thereto; wherein said first means comprises a first load substantially identical to the load of a bit line and being connected between a first reference voltage and a drain of the first floating-gate transistor; and wherein the verification voltage is provided from a node between the first load and the first floating-gate transistor.

15. A memory according to claim 14, wherein said first means further comprises a second transistor for connecting a source of the first floating-gate transistor to a second reference voltage.

16. A memory according to claim 14, further comprising a register having parallel outputs for containing the information representing the word to be verified in the memory; and wherein the second means comprises:
   n second floating-gate transistors having floating gates charged to correspond to a second state of a bit memorized in an ideal manner, the n second floating-gate transistors also having sources being connected to the source of the first floating-gate transistor;
   n switching transistors having sources respectively connected to drains of the n second floating-gate transistors and having gates connected to parallel outputs of the register containing the information representing the word to be verified in the memory; and
   n loads substantially identical to the loads of the bit lines, each of the n loads being connected firstly to the first reference voltage and, secondly, respectively, to drains of the n switching transistors.

17. A memory according to claim 14, further comprising a register having parallel outputs for containing the information representing the word to be verified in the memory, wherein n=$2^m$, and wherein the second means comprises:
   m second floating-gate transistors having floating gates charged to correspond to a second state of a bit memorized in an ideal manner, the m second floating-gate transistors having sources connected to the source of the first floating-gate transistor;
   a decoder receiving n parallel outputs from the register containing the word to be verified in the memory and supplying, on m control lines, a binary data element representing a number of bits of the information element that are in the second state; and
   m switching transistors having sources respectively connected to drains of the m second floating-gate transistors and having gates connected to the m control lines.

18. A memory according to claim 17, wherein the second means comprises m loads, each representing a fraction, ranging from 1 to $2^{m-1}$, of the load of a bit line, each of the m loads being connected firstly to the first reference voltage and, secondly, respectively to drains of the m switching transistors.

19. A memory according to claim 17, further comprising a plurality of second bit lines and respective current sources connected thereto for serving as loads; wherein the second means comprises m current sources each representing a multiple of a power of two of a current source used as a load, each of the m current sources being connected firstly to the first reference voltage and, secondly, respectively to drains of the m switching transistors.

20. A memory according to claim 12, further comprising a register having n parallel outputs containing the information representing the word to be verified in the memory; wherein the second means comprises a decoder receiving the n parallel outputs from the register and outputting a command representing a number of bits of the information element that are in the second state.

21. A memory according to claim 20, wherein the second means comprises a controlled current source which receives the command; wherein the controlled current source has a first terminal connected to a first reference voltage; and wherein the first means comprises a floating-gate transistor having a floating-gate charged to correspond to a first state of a bit memorized in an ideal manner, the floating-gate transistor having a drain being connected to a second terminal of the controlled current source, the floating-gate transistor having a source being connected to a second reference voltage, a node located between the controlled current source and the floating-gate transistor supplying the verification voltage.

22. A method for producing a verification voltage to carry out a verification of a word in an electrically programmable non-volatile memory organized in n-bit words and comprising a plurality of storage transistors, the method comprising the steps of:
   supplying a first voltage corresponding to a voltage desired at the terminals of a storage transistor which is in a first state; and
   correcting the first voltage as a function of an information element that corresponds to the word to be verified.

23. A method according to claim 12, wherein the supplying step comprises the steps of:
   providing a first floating-gate transistor having a floating-gate; and
   charging the floating-gate of the first floating-gate transistor to correspond to a first state of a bit memorized in an ideal manner.

24. A method according to claim 23, wherein the memory further comprises a plurality of bit lines and respective loads connected thereto; and wherein the supplying step comprises connecting a first load substantially identical to the load of a bit line between a first reference voltage and a drain of the first floating-gate transistor so that the verification voltage is provided from a node between the first load and the first floating-gate transistor.

25. A method according to claim 24, further comprising the step of providing a register having parallel outputs for containing the information representing the word to be verified in the memory; and wherein the step of correcting comprises the steps of:

providing n second floating-gate transistors and charging the floating-gates thereof to correspond to a second state of a bit memorized in an ideal manner, the n second floating-gate transistors also having sources being connected to the source of the first floating-gate transistor;

providing n switching transistors having sources respectively connected to drains of the n second floating-gate transistors and having gates connected to parallel outputs of the register containing the information representing the word to be verified in the memory; and providing n loads substantially identical to the loads of the bit lines, each of the n loads being connected firstly to the first reference voltage and, secondly, respectively, to drains of the n switching transistors.

26. A method according to claim 24, further comprising the step of providing a register having parallel outputs for containing the information representing the word to be verified in the memory, wherein $n=2^m$, and wherein the step of correcting comprises the steps of:

providing m second floating-gate transistors and charging the floating gates thereof to correspond to a second state of a bit memorized in an ideal manner, the m second floating-gate transistors having sources connected to the source of the first floating-gate transistor;

providing a decoder receiving n parallel outputs from the register containing the word to be verified in the memory and supplying, on m control lines, a binary data element representing a number of bits of the information element that are in the second state; and providing m switching transistors having sources respectively connected to drains of the m second floating-gate transistors and having gates connected to the m control lines.

\* \* \* \* \*